(12) United States Patent
Hahn et al.

(10) Patent No.: US 8,615,207 B2
(45) Date of Patent: Dec. 24, 2013

(54) POWER AMPLIFIER LINEARIZATION FEEDBACK METHODS AND SYSTEMS

(75) Inventors: Wilhelm Steffen Hahn, Los Altos, CA (US); Wei Chen, Newark, CA (US)

(73) Assignee: Intersil Americas Inc., Milpitas, CA (US)

( * ) Notice: Subject to any disclaimer, the term of this patent is extended or adjusted under 35 U.S.C. 154(b) by 429 days.

(21) Appl. No.: 13/014,655

(22) Filed: Jan. 26, 2011

(65) Prior Publication Data

US 2011/0190028 A1   Aug. 4, 2011

Related U.S. Application Data

(60) Provisional application No. 61/300,328, filed on Feb. 1, 2010, provisional application No. 61/332,038, filed on May 6, 2010, provisional application No. 61/375,491, filed on Aug. 20, 2010.

(51) Int. Cl.
*H01Q 11/12* (2006.01)
*H04B 1/04* (2006.01)

(52) U.S. Cl.
USPC .................. 455/127.1; 455/114.1; 455/115.1; 330/127

(58) Field of Classification Search
USPC .......... 455/114.1–114.3, 115.1, 127.1–127.3; 330/127
See application file for complete search history.

(56) References Cited

U.S. PATENT DOCUMENTS

| | | | |
|---|---|---|---|
| 7,231,191 B2 * | 6/2007 | Posner et al. | 455/114.3 |
| 7,301,397 B2 * | 11/2007 | Arbab et al. | 330/151 |
| 7,693,497 B2 * | 4/2010 | Wilkinson et al. | 455/127.1 |
| 7,917,106 B2 * | 3/2011 | Drogi et al. | 455/127.1 |

* cited by examiner

*Primary Examiner* — Nhan Le
(74) *Attorney, Agent, or Firm* — King & Spalding

(57) ABSTRACT

Linearizers can improve the linearity of power amplifiers by canceling or reducing amplitude of non-linearity components, (e.g., IM3, IM5, IM7, IM9, etc.) generated by the power amplifier. The linearizers can obtain samples of signals output by the power amplifier and process the samples to produce a compensation signal that is applied onto or into a transmission path leading to the power amplifier's input. The compensation signal is generated such that when amplified by the power amplifier, the amplified compensation signal cancels or reduces at least a portion of the non-linearity components produced by the power amplifier. A controller can improve the correction of the non-linearity components by executing one or more calibration algorithms and/or one or more tuning algorithms and adjusting settings of the linearizer based on the results of the algorithm(s).

25 Claims, 10 Drawing Sheets

POWER AMPLIFIER LINEARIZATION FEEDBACK METHODS AND SYSTEMS

CROSS REFERENCE TO RELATED APPLICATIONS

This patent application claims to the benefit of U.S. Provisional Patent Application No. 61/300,328, entitled "System and Method for Cancellation-Based Pre-Distortion Power Amplifier Linearization," and filed Feb. 1, 2010. This patent application also claims to the benefit of U.S. Provisional Patent Application No. 61/332,038, entitled "Power Amplifier Linearization Feedback Method and System," filed May 6, 2010. This patent application also claims to the benefit of U.S. Provisional Patent Application No. 61/375,491, entitled "Methods and Systems for Noise and Interference Cancellation" and filed Aug. 20, 2010. The entire contents of each of the foregoing priority applications are hereby incorporated herein by reference.

BRIEF DESCRIPTION OF THE DRAWINGS

FIG. 4, is a logical flow diagram depicting a method for calibrating the linearizer of FIG. 1, in accordance with certain exemplary embodiments.

Figure 1:
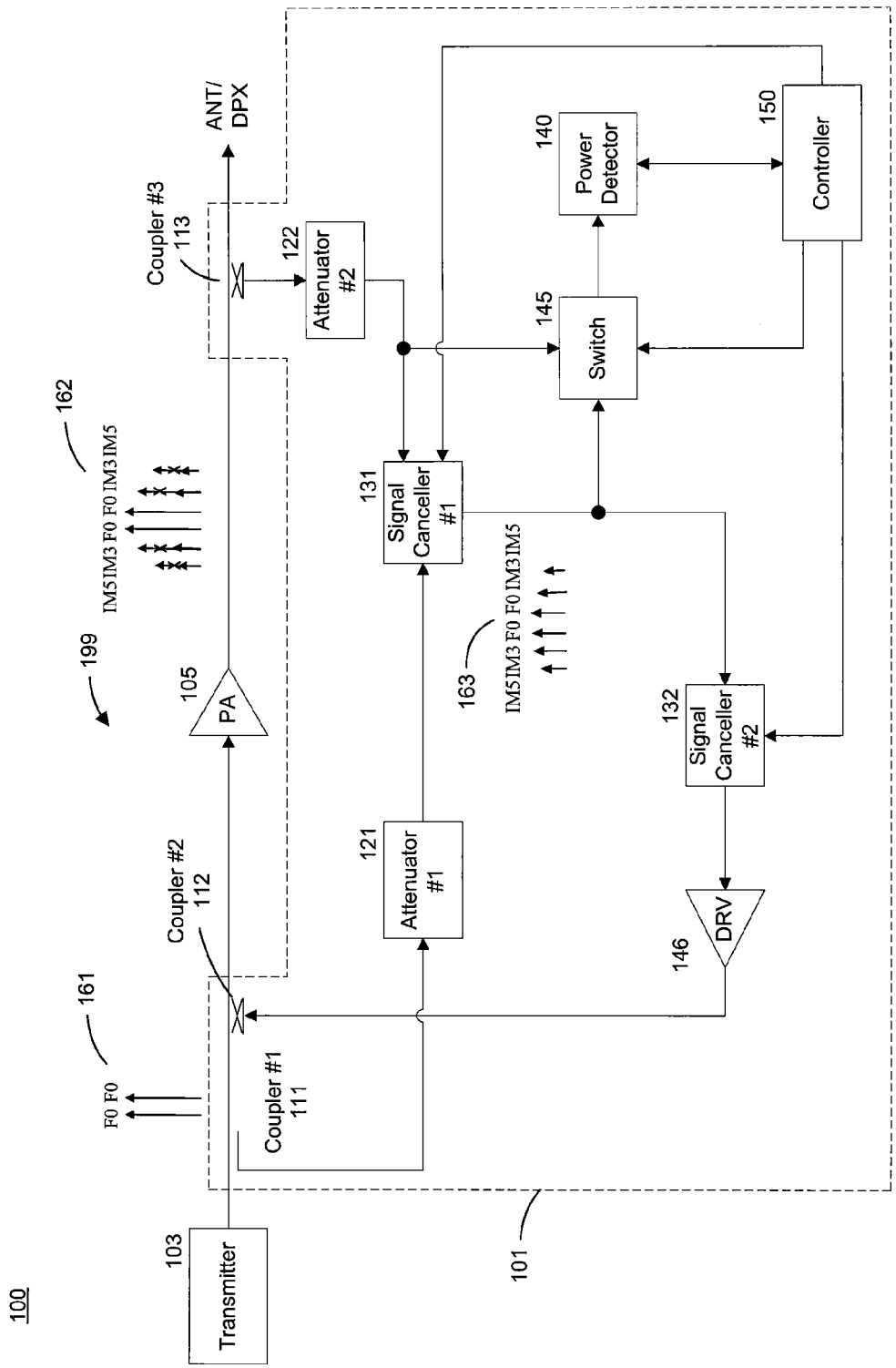
FIG. 1 is a functional block diagram of a system having a linearizer for improving the linearity of a power amplifier, in accordance with certain exemplary embodiments.

Many aspects of the invention can be better understood with reference to the above drawings. The drawings illustrate only exemplary embodiments of the invention and are therefore not to be considered limiting of its scope, as the invention may admit to other equally effective embodiments. The elements and features shown in the drawings are not necessarily to scale, emphasis instead being placed upon clearly illustrating the principles of exemplary embodiments of the present invention. Additionally, certain dimensions may be exaggerated to help visually convey such principles. In the drawings, reference numerals designate like or corresponding, but not necessarily identical, elements.

DETAILED DESCRIPTION OF EXEMPLARY EMBODIMENTS

The present invention is directed to methods and systems for improving the linearity of power amplifiers by canceling or reducing non-linearity components, (e.g., IM3, IM5, IM7, IM9, etc.) and other unwanted spectral components generated by the power amplifier or components along the transmit path of a signal transmitter. Exemplary embodiments described herein can support canceling, correcting, addressing, or compensating for intermodulation products, interference, electromagnetic interference ("EMI"), noise, or other unwanted spectral components. With improved linearity, the Adjacent Channel Power Ratio ("ACPR"), the output power, and/or the power consumption of the power amplifier can be improved. Thus, the efficiency of the power amplifier is increased.

Turning now to the drawings, in which like numerals indicate like (but not necessarily identical) elements throughout the figures, exemplary embodiments of the invention are described in detail. FIG. 1 is a block diagram depicting a system 100 having a linearizer 101 for improving the linearity of a power amplifier 105, in accordance with certain exemplary embodiments. The exemplary linearizer 101 improves the linearity of the power amplifier 105 by canceling or reducing the amplitude of non-linearity components of signals output by the power amplifier 105. Referring to FIG. 1, the power amplifier 105 is disposed along a transmit path 199 of a transmitter 103 to receive and amplify signals 161 transmitted by the transmitter 103. In this exemplary embodiment, the transmitter 103 transmits a signal 161 having fundamental tones F0 in the radio frequency ("RF") band. However, the linearizer 101 is not limited to the RF band, but instead also can be used to improve the linearity of signals in other frequency bands (e.g., intermediate frequencies) or applications (e.g., cable television amplifiers, and test equipment, such as automatic test equipment ("ATE") and generators).

The power amplifier 105 adjusts the amplitude of the signal 161 transmitted by the transmitter 103 and outputs an amplitude adjusted signal 162. As described in further detail below, the linearizer 101 improves the linearity of the power amplifier 105 by processing samples of the output signal 162 from the power amplifier 105 to generate a compensation signal that is applied onto or into the input signal 161. In certain exemplary embodiments, the power amplifier 105 includes a single-stage amplifier and the linearizer 101 processes samples of the output signal 162 from the single-stage amplifier. In certain alternative exemplary embodiments, the power amplifier includes a multi-stage amplifier and the linearizer processes samples of the output signal 162 from the final stage amplifier of the multi-stage amplifier.

When a power amplifier 105 adjusts the amplitude of an input signal 161, non-linear intermodulation products, such as intermodulation products IM3, IM5, etc., can be introduced as illustrated onto the output signal 162. These intermodulation products can degrade the performance of the power amplifier 105 by decreasing the ACPR and/or causing an increase in the power consumption of the power amplifier 105. The exemplary linearizer 101 reduces, suppresses, eliminates, or otherwise compensates for these intermodulation products by applying a compensation signal onto or into the input signal 161 upstream from the input of power amplifier 105.

The exemplary linearizer 101 includes an inner loop having a first signal canceller 131 and an outer loop having a second signal canceller 132. In certain exemplary embodiments, one or both of the signal cancellers 131, 132 include multiple individual cancellers (e.g., arranged in parallel) to increase the compensation bandwidth of the intermodulation products. In certain exemplary embodiments, the signal cancellers 131, 132 include noise cancellers, such as an RF noise canceller.

In addition to the signal canceller 131, the inner loop includes two couplers 111, 113 (either one or both may be directional) and two attenuators 121, 122. The coupler 111 obtains samples of the input signal 161 and provides these sampled input signals to the signal canceller 131 via the attenuator 121. The coupler 113 obtains samples of the output signal 162 and provides these sampled output signals to the signal canceller 131 via the attenuator 122. The attenuators 121, 122 are optional devices that are used to reduce the amplitude or power of the sampled signals to a level appropriate for the signal cancellers 131, 132. The attenuators 121, 122 enable the linearizer 101 to be used with signals of various power levels without limiting the linearization performance or damaging the signal cancellers 131, 132.

The signal canceller 131 of the inner loop subtracts the sampled input signal received from coupler 111 from the sampled output signal received from coupler 113 and produces an output signal 163. Thus, the amplitude of the fundamental tones F0 component of the output signal 163 is reduced relative to that of the signal 162 output by the power amplifier 105 while the amplitude of the intermodulation components (e.g., IM3, IM5, etc.) remains substantially unchanged or similar to that of the signal 162 (minus any amplitude losses that occur between the output of the power amplifier 105 and the output of the variable attenuator 122). In certain exemplary embodiments, the fundamental tones F0 component of the signal 163 is cancelled entirely by the signal canceller 131. In certain alternative embodiments, the amplitude of the fundamental tones F0 component of the output signal 163 is reduced to a level similar to that of one or more of the intermodulation products of the signal 163. For example, as shown in the exemplary output signal 163 illustrated in FIG. 1, the fundamental tones F0 component has an amplitude similar to that of the third order intermodulation products IM3.

The signal canceller 131 is connected to a controller 150 that adjusts settings of the signal canceller 131. In certain exemplary embodiments, the signal canceller 131 includes an I/Q modulator and the controller 150 adjusts the in-phase ("I-value") and quadrature ("Q-value") settings of the I/Q modulator. The signal canceller 131 adjusts at least one of the amplitude, phase, and delay of one or more components of samples of the signal 162 relative to samples of the signal 161 in response to the settings specified by the controller 150. By making these adjustments, the controller 150 adjusts the amount of reduction to the amplitude of the fundamental tones F0 in the signal 163. Reducing the power level of the fundamental tones F0 to a level similar to that of the intermodulation products accommodates the dynamic range requirements of components of a power detector 140 and the signal canceller 132 and also avoids causing signal to noise ratio problems or other problems for complex modulation (e.g., 64 QAM).

In certain exemplary embodiments, the signal canceller 131 adjusts one or more of the phase, amplitude, and delay of the sampled input signal received from the coupler 111 prior to subtracting the sampled input signal from the sampled output signal received from the coupler 113. The controller 150 (or the signal canceller 131) can monitor the amplitude and phase of the fundamental tones component of the sampled input signal and the amplitude and phase of the fundamental tones component of the sampled output signal and adjust one or more of the phase, amplitude, and delay of the sampled input signal based on these parameters. The signal canceller 131 can adjust one or more of the phase, amplitude, and delay of the sampled input signal (e.g., via settings specified by controller 150) such that during the subtraction process, the fundamental tones component of the sampled input signal is approximately 180° out of phase with respect to the fundamental tones component of the sampled output signal. The signal canceller 131 also can adjust one or more of the phase, amplitude, and delay of the sampled input signal (e.g., via settings specified by controller 150) such that during the subtraction process, the fundamental tones component of the sampled input signal is approximately equal in magnitude to the fundamental tones component of the sampled output signal.

The signal 163 output by the signal canceller 131 is sent to the outer loop of the linearizer 101. In addition to the signal canceller 132, the outer loop includes an optional driver 146 and a coupler 112 (which may be directional). The components of the outer loop adjust the amplitude and phase (and optionally the delay) of the intermodulation products in the signal 163 received from the signal canceller 131 to produce a compensation signal that, when applied to the input signal 161 of the power amplifier 105, the intermodulation products produced by the power amplifier 105 will be cancelled or reduced in amplitude at the output of the power amplifier 105. Thus, the output from the power amplifier 105 exhibits more linearity.

The signal canceller 132 can include an I/Q modulator operable to adjust at least one of the amplitude, phase, and delay of components of the signal 163 in response to settings received from the controller 150. For example, the controller 150 can adjust the I-value and Q-value settings of the I/Q modulator. The driver 146 of the outer loop is an optional component that can be included in the exemplary linearizer 101 to further adjust the amplitude of the compensation signal before the compensation signal is applied to the input of the power amplifier 105. In certain exemplary embodiments, the driver 146 includes an amplifier having less linearity than the power amplifier 105 itself. The compensation signal generated by the linearizer 101 is applied to the input of the power amplifier 105 by way of coupler 112.

Figure 2:
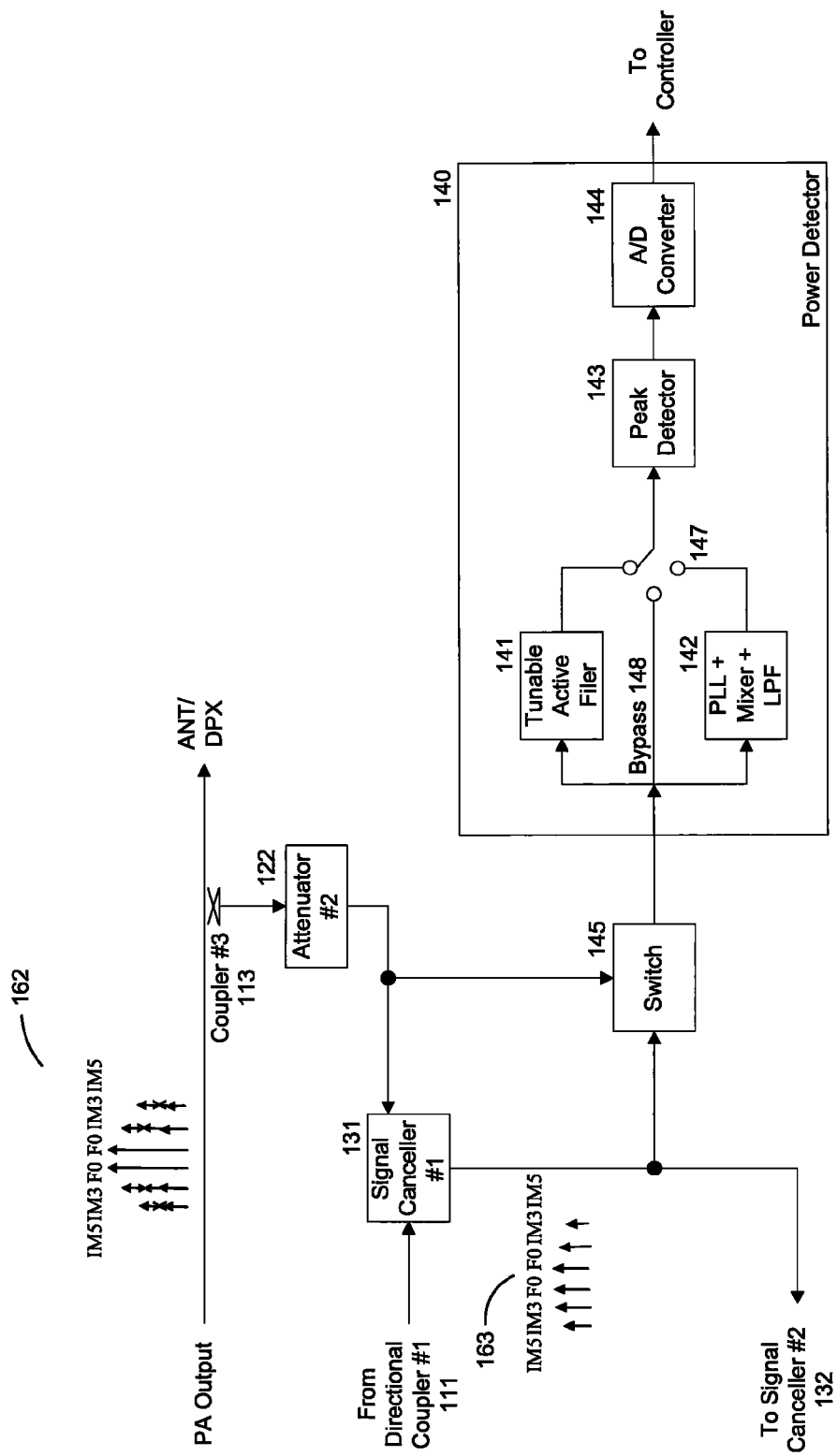
FIG. 2 is a functional block diagram depicting certain components of the linearizer of FIG. 1, in accordance with certain exemplary embodiments.

The power detector 140 of the linearizer 101 is connected to the input and output of the signal canceller 131 by way of a switch 145 or relay. The power detector 140, which is described in more detail below in connection with FIG. 2, is configurable to measure the overall power level of a signal (e.g., the signal at the input of the signal canceller 131 or the signal 163 at the output of the signal canceller 131) or to measure the power level for a particular frequency band. That is, the power detector 140 is frequency selective. In one example, the power detector 140 is configured to measure the power level of the fundamental tones F0 present in the signal 163. In another example, the power detector 140 is configured to measure the power level of one or more orders of intermodulation products (e.g., third order and/or fifth order). The power detector 140 is communicably coupled to the controller 150 to receive configuration settings from the controller 150 and to provide power level measurements to the controller 150.

Figure 4A:
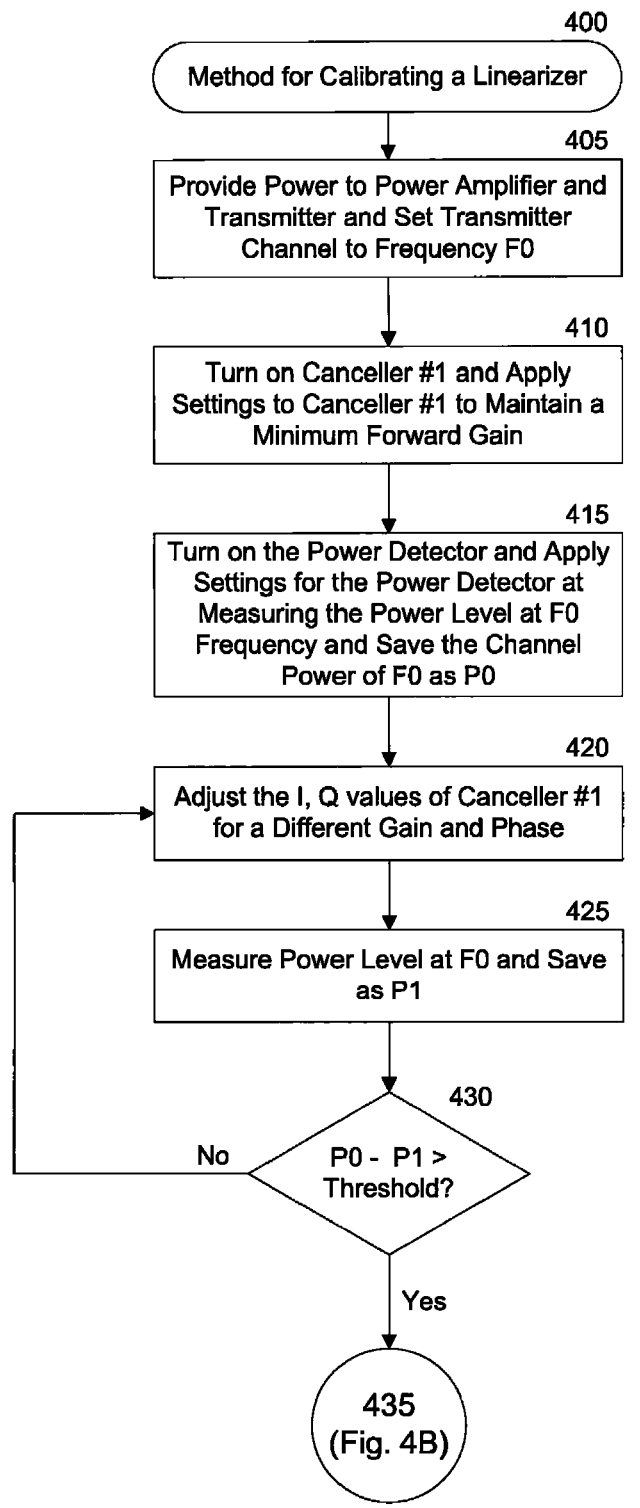
FIGS. 4A and 4B, collectively
Figure 4B:
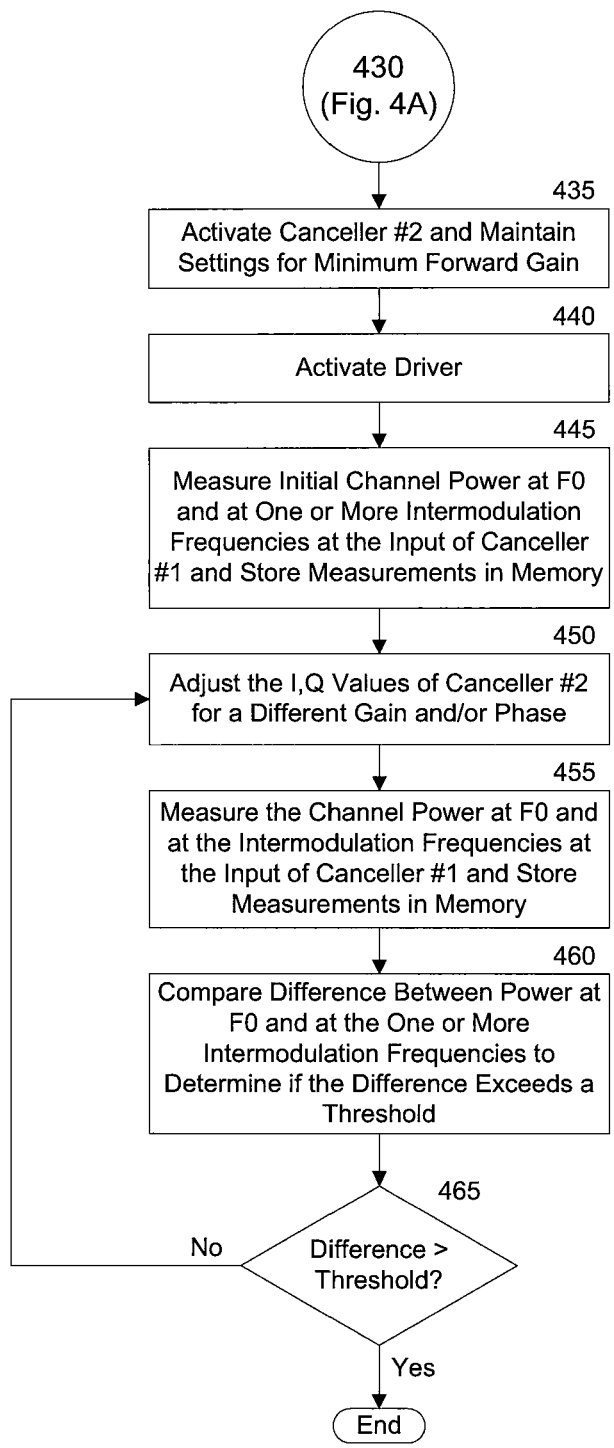

The controller 150 is implemented in the form of a processor, microprocessor, microcontroller, computer, state machine, programmable device, or other appropriate technology. The controller 150 executes a calibration algorithm (FIG. 4) and one or more additional algorithms to adjust certain settings of the linearizer 101 (e.g., I-value and Q-value of the signal cancellers 131, 132) to improve the cancellation or reduction of non-linearity components at the output of the power amplifier 105. During execution of the algorithms, the controller 150 monitors power measurements received from the power detector 140 to determine preferred settings for the signal cancellers 131, 132. Exemplary algorithms that may be implemented by the controller 150 in certain exemplary embodiments described herein are disclosed in U.S. patent application Ser. No. 13/014,681, entitled, "Methods and Systems for Noise and Interference Cancellation," and filed on the same date as this application. The entire contents of U.S. patent application Ser. No. 13/014,681, entitled, "Methods and Systems for Noise and Interference Cancellation," and filed on the same date as this application, are hereby fully incorporated herein by reference. The algorithms executed by the controller 150 can include one or more of a binary correction algorithm ("BCA"), a fast binary algorithm ("FBA"), a minstep algorithm ("MSA"), a blind shot algorithm ("BSA"), a dual slope algorithm ("DSA"), and a track and search algorithm described in U.S. patent application Ser. No. 13/014,681, entitled, "Methods and Systems for Noise and Interference Cancellation," and filed on the same date as this application. In the execution of any of the aforementioned algorithms, the controller 150 can use one or more of the power measurements received from the power detector 140 as a feedback value to identify preferred settings for the signal cancellers 131, 132.

FIG. 2 is a functional block diagram depicting certain components of the linearizer 101 in more detail, in accordance with certain exemplary embodiments. In particular, FIG. 2 depicts the coupler 113, the attenuator 122, the signal canceller 131, the switch 145, and certain exemplary components of the power detector 140. Referring to FIG. 2, the power detector 140 is connected to a signal path leading to the input of the signal canceller 131 and to a signal path extending from the output of signal canceller 131 by way of the switch 145. As briefly described above with reference to FIG. 1, the power detector 140 can measure the overall power level or the power level of one or more of the intermodulation products and the fundamental tones F0 of the signals at the input and output of the signal canceller 131. In certain exemplary embodiments, the controller 150 operates the switch 145 using a control signal to switch between a power measurement at the input of the signal canceller 131 and a power measurement at the output of the signal canceller 131. In certain alternative embodiments, the switch 145 is a manual switch operated by a user.

The exemplary power detector 140 includes a tunable active filter 141, a PLL+Mixer+LPF 142, a peak detector 143, an analog to digital converter ("A/D converter") 144, and a bypass 148. The controller 150 selects between the tunable active filter 141, the PLL+Mixer+LPF 142, and the bypass 148 via a switch 147. In alternative exemplary embodiments, one or more of the components 141, 142, 148 can be omitted. In one example, the power detector 140 includes the tunable active filter 141, or the PLL+Mixer+LPF 142, or the bypass 148 only. The bypass 148 allows the power detector 140 to measure the overall power of a signal without being filtered by either the tunable active filter 141 or the PLL+Mixer+LPF 142.

The tunable active filter 141 provides band-pass filtering for one or more intermodulation products and/or the fundamental tones F0 contained in a signal and output those intermodulation products and/or fundamental tones F0 to the peak detector 143. In certain exemplary embodiments, the components of the signal passed to the peak detector 143 by the tunable active filter 141 is selected by the controller 150 based on a method 400 depicted in FIG. 4. This tunable active filter 141 allows the controller 150 to specifically monitor the power level of the selected intermodulation products or fundamental tones F0 being cancelled from the signal 162. This enables the controller 150 to modify the settings of one or both signal cancellers 131, 132 to improve the cancellation of the intermodulation products or fundamental tones F0. This feature is useful when the fundamental tones F0 are reaching a power level similar to that of the intermodulation products. In certain exemplary embodiments, the tunable active filter 141 includes a tunable active filter similar to or substantially the same as the tunable active filter described in patent application Ser. No. 12/413,454, entitled "Filter Shaping Using a Signal-Cancellation Function," filed Mar. 27, 2009. The complete disclosure of U.S. patent application Ser. No. 12/413,454 is hereby fully incorporated herein by reference.

The PLL+Mixer+LPF 142 includes a phase-locked loop ("PLL"), a mixer, and a low pass filter ("LPF"). The PLL+Mixer+LPF 142 applies a down conversion and a channel select filter to pass a specific intermodulation product (or fundamental tones F0) of a signal to the peak detector 143. Similar to the tunable active filter 141, the specific frequencies of a signal passed to the peak detector 143 can be selected by the controller 150 based on the method 400 depicted in FIG. 4.

The peak detector 143 is connected to the outputs of the tunable active filter 141 and the PLL+Mixer+LPF 142 to measure the power level of the filtered signals. If the switch 147 is positioned such that the bypass is active, signals are passed to the peak detector 143 without frequency filtering. This enables the peak detector 143 to measure the overall power level of the signals. The peak detector 143 measures the power level of signals and provides the measured power level to the A/D converter 144. The A/D converter 144 converts the power measurement to a digital format and provides the digital version of the power measurement to the controller 150.

The controller 150 uses the power measurement received from the power detector 140 and the method 400 depicted in FIG. 4 to produce a compensation signal that, when applied to the input of the power amplifier 105, reduces or cancels the intermodulation products that were present on the output signal 162 from the power amplifier 105. The controller 150 may execute the method 400 for multiple iterations until a desired level of linearity is achieved. In certain exemplary embodiments, this compensation signal at the output of power amplifier 105 includes a signal having the intermodulation products with an amplitude close or equal to that produced by the power amplifier 105, and a 180° phase shift with respect to the signal 162.

In certain exemplary embodiments, delay compensation for both sampling paths (e.g., couplers 111, 113) and cancellation paths (e.g., signal cancellers 131, 132) is employed in the exemplary linearizer 101 to maximize the cancellation bandwidths in order to cover the full frequency range of the transmitter by various communication standards.

Figure 3:
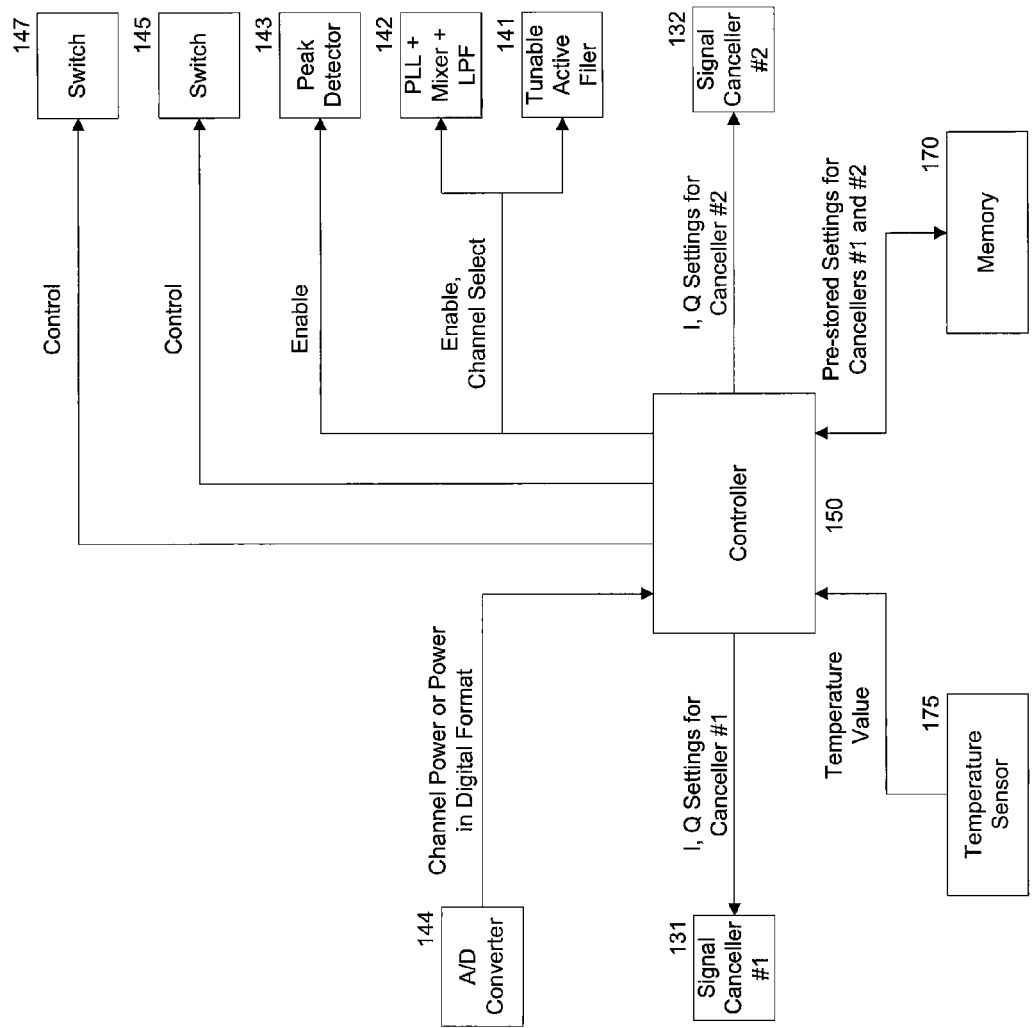
FIG. 3 is a functional block diagram depicting certain components of the linearizer of FIG. 1, in accordance with certain exemplary embodiments.

FIG. 3 is a block diagram depicting certain components of the linearizer 101 illustrated in FIG. 1 in accordance with certain exemplary embodiments. Referring to FIG. 3, the controller 150 is communicably coupled to each of the signal cancellers 131, 132. The controller 150 can provide I-value and Q-value settings for each of the signal cancellers 131 and 132 in order to cancel or reduce the intensity of the intermodulation products present at the output of the power amplifier 105. As described in further detail below with reference to FIGS. 4A and 4B, the controller 150 adjusts the settings for the signal cancellers 131, 132 based on an algorithm (e.g., BCA, FBA, MSA, BSA, DSA, or track and search) using power measurements received from the power detector 140. The algorithm can be stored in memory at the controller 150 or in an external memory device 170 (e.g., RAM, ROM, or flash memory, etc.) accessible to the controller 150. In certain exemplary embodiments, the external memory 170 also stores current or preferred (e.g., temperature and band related) settings for the signal cancellers 131, 132.

The controller 150 is also communicably coupled to the tunable active filter 141, the PLL+Mixer+LPF 142, the switch 147, the peak detector 143, and the switch 145. The controller 150 provides an enable signal to each of the tunable active filter 141, the PLL+Mixer+LPF 142, and the peak detector 143. The controller 150 also provides a channel select signal to the tunable active filter 141 and the PLL+Mixer+LPF 142 in order to select the frequency or frequency band (e.g., F0, IM3, IM5, etc.) for which power should be measured. Similarly, the controller operates the switch 147 to select which path the signal takes to the peak detector 143. Additionally, the controller 150 operates the switch 145 to switch between power measurements of the signal at the input of the canceller 131 and the signal 163 at the output of the signal canceller 131.

In this exemplary embodiment, the controller 150 is connected to a temperature sensor 175 that measures the temperature of or proximal to the linearizer 101. This temperature measurement can be used during the execution of one or more algorithms to improve the linearization of the power amplifier 105.

In certain exemplary embodiments, the controller 150 also communicates with external devices to receive control commands, such as a command to enable the components of the power detector 140 or a command to select a particular channel of the tunable active filter 141 or the PLL+Mixer+LPF 142. The controller 150 also provides an interface for a user to monitor the signals 162 and 163 and to adjust settings at the controller 150, such as settings for an algorithm (e.g., BCA, FBA, MSA, BSA, DSA, or track and search) or the settings for the signal cancellers 131, 132. The user interface also allows a user to enable the components of the power detector 140 or select a channel for the tunable active filter 141 or the PLL+Mixer+LPF 142.

FIG. 4 is a flow diagram depicting a method 400 for calibrating the linearizer 101 of FIG. 1, in accordance with certain exemplary embodiments. Referring to FIGS. 1, 2, and 4, in block 405, power is provided to the power amplifier 105 and to the transmitter 103. The transmitter 103 is set to provide an RF signal having fundamental tones F0.

In block 410, the controller 150 activates the signal canceller 131 in the inner loop of the linearizer 101 and provides initial settings (e.g., initial I-value and Q-value) to the signal canceller 131 to maintain minimum forward gain.

In block 415, the controller 150 operates the switch 145 to connect the input of the power detector 140 to the output of the signal canceller 131. The controller 150 also enables one of the tunable active filter 141 or the PLL+Mixer+LPF 142 and provides a channel selection thereto to measure the power level at the fundamental tones F0 of the signal 163 at the output of the signal canceller 131. The controller 150 also enables the peak power detector 143 to measure the power level of the signal passed from the selected filter 141 or 142. The controller 150 receives this power measurement from the peak detector 143 via the A/D converter 144 and stores the measurement as P0 in memory.

In block 420 the controller 150 adjusts the I-value and the Q-value of the signal canceller 131 for a different phase and/or gain based on an algorithm (e.g., BCA, FBA, MSA, BSA, DSA, or track and search) to reduce the power level of the fundamental tones F0 of signal 163. In block 425, the controller 150 receives an updated power measurement of the fundamental tones F0 of the signal 163 from the peak detector 143 and stores this updated power measurement as P1.

In block 430, the controller 150 determines the difference between P0 and P1 and compares this difference to a threshold to determine if the power level of signal 163 at the fundamental tones F0 has been reduced sufficiently. In one example, the threshold is set at 30 dB. If the difference between P0 and P1 exceeds this threshold, the method 400 proceeds to block 435. Otherwise, the method 400 returns to block 420 and the controller 150 continues to adjust the I-value and the Q-value of the signal canceller 131 based on the algorithm (e.g., BCA, FBA, MSA, BSA, DSA, or track and search) until this threshold is reached or exceeded, for example by taking the calculated difference as the feedback value for executing the algorithm(s). Alternatively, a similar algorithm may vary all bits (in embodiments where the I-value and Q-value are communicated to the signal cancellers 131, 132 via digital words) of the I-value and all the bits of the Q-value of the canceller 131 to converge at a maximum or preferred cancellation or reduction (for those possible I-values and Q-values) of the fundamental tones F0 before proceeding to block 435.

In block 435, the controller 150 activates the signal canceller 132 in the outer loop of the linearizer 101 and provides initial settings (e.g., initial I-value and Q-value) to the signal canceller 132 to maintain minimum forward gain. In block 440, the controller 150 activates the driver 146.

In block 445, the controller 150 operates the switch 145 to connect the input of the power detector 140 to the input of the signal canceller 131. The controller 150 also enables one of the tunable active filter 141 or the PLL+Mixer+LPF 142 to measure the power level at the input of the signal canceller 131, connected to the output of the attenuator 122 via the switch 145. The controller 150 provides one or more channel selections to the selected filter 141 or 142. For example, the controller 150 may first enable the tunable active filter 141 and select channel F0 for measurement. Then, the controller 150 can select intermodulation products IM3 and IM5 for measurement by the tunable active filter 141. The controller 150 then saves the channel power measurements at F0, IM3, and IM5 as A0, A3, and A5, respectively. Although the power levels at only three intermodulation products are measured in this example, the power level at any number of intermodulation products may be measured.

In block 450, the controller 150 adjusts the I-value and Q-value of the signal canceller 132 for a different phase and/or gain based on the algorithm (e.g., BCA, FBA, MSA, BSA, DSA, or track and search) to reduce the power level of each intermodulation product of the output signal of the power amplifier 105. In block 455, controller 150 receives an updated power measurement at the input of the signal canceller 131 at the fundamental tones F0 and at the frequency of the intermodulation products from the power detector 140 and stores these updated power measurements as A0', A3', and A5', respectively.

In block 460, the controller 150 compares the difference between the power at the fundamental tones F0 (A0 values) and the power at each of the one or more intermodulation products (Axy values) to determine if each of these differences exceeds a threshold, and thus achieves a desired linearization. In certain exemplary embodiments, this threshold is set at 45 dBc for certain intermodulation products, such as the third order intermodulation products IM3. If each (or some) of the differences exceed this threshold, the method 400 ends. Otherwise, the method 400 returns to block 450 and the controller 150 continues to execute the algorithm (e.g., BCA, FBA, MSA, BSA, DSA, or track and search) to adjust the I-value and the Q-value of the signal canceller 132 until the desired level of linearization is reached, for example by taking the calculated difference as the feedback value for executing the algorithm(s). Additionally, a similar algorithm as described in section [0040] may be used, for example by varying all bits of the I-value and all the bits of the Q-value of the canceller 132 to converge at a maximum or preferred cancellation or reduction generally avoiding having to define a particular threshold. Rather, the controller 150 can repeat blocks 450-460 until an acceptable level of cancellation is reached or exceeded.

Figure 5:
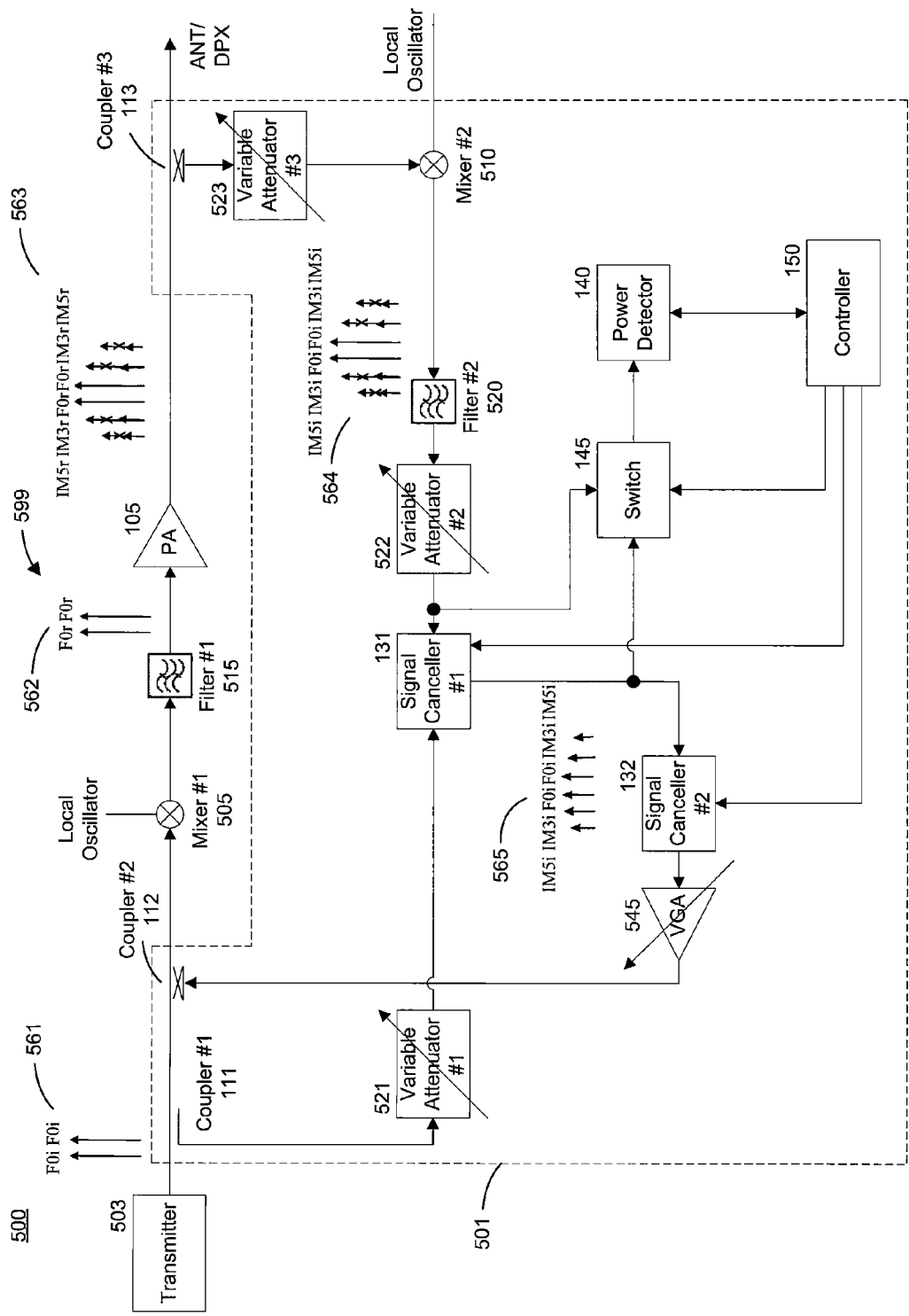
FIG. 5 is a functional block diagram of a system having a linearizer for improving the linearity of a power amplifier, in accordance with certain exemplary embodiments.

FIG. 5 is a functional block diagram of a system 500 having a linearizer 501 for improving the linearity of a power amplifier 105, in accordance with certain exemplary embodiments. The exemplary linearizer 501 improves the linearity of the power amplifier 105 by canceling or reducing the amplitude of non-linearity components of signals output by the power amplifier 105. The linearizer 501 is an alternative embodiment to the linearizer 101 illustrated in FIG. 1 and discussed above. Referring to FIG. 5, the system 500 includes many of the same elements of the system 100 illustrated in FIG. 1. In particular, the system 500 includes the power amplifier 105 and the linearizer 501 for canceling or reducing intermodulation products generated by the power amplifier 105. The linearizer 501 includes couplers 111-113, signal cancellers 131, 132, a power detector 140, a switch 145, and a controller 150 that can each be the same as or substantially similar to the corresponding elements of the linearizer 101 illustrated in FIG. 1. However, the exemplary system 500 also includes frequency conversion features.

In this exemplary embodiment, a transmitter 503 transmits a signal 561 (e.g., via a quadrature modulator) along a transmit path 599. The transmitted signal 561 primarily includes fundamental tones F0$i$. The designator "i" indicates that the frequency of the fundamental tones F0$i$ is at an intermediate frequency ("IF"). The signal 561 is passed from the transmitter 501 to a mixer 505 that converts the frequency of the signal 561 by mixing the signal 561 with a local oscillator signal to produce signal 562. The frequency converted signal 562 includes fundamental tones F0$r$ at a carrier frequency, rather than the IF. The designator "r" indicates that the frequency of the fundamental tones F0$r$ is at RF or at any other carrier frequency. The frequency converted signal 562 is passed to the power amplifier 105 for amplification. This amplification often results in intermodulation products (e.g., IM3, IM5, IM7, etc.) or other non-linearity components in the power amplifier output signal 563.

The exemplary system 500 also includes an optional image reject filter 515 disposed between the mixer 505 and the power amplifier 105. This image reject filter 515 rejects the image components generated by the mixer 505.

The coupler 111 (which may be directional) samples the fundamental tones F0$i$ at the output of the transmitter 503 and provides this sampled input signal to a variable attenuator 521. The variable attenuator 521 attenuates the sampled input signal and provides the attenuated signal to signal canceller 131. The variable attenuator 521 is an optional device that is used to adjust the amplitude or power of the sampled signal to a level appropriate for the signal canceller 131.

The signal 563 output by the power amplifier 105 and having the fundamental tones F0$r$ and the intermodulation products (e.g., IM3$r$, IM5$r$, etc.) is sampled by coupler 113 at the output of the power amplifier 105. This sampled output signal is passed to a variable attenuator 523 that attenuates the sampled output signal and provides the attenuated output signal to mixer 510. Similar to the variable attenuator 521, the attenuator 523 is optional and is used to adjust the amplitude or power of the sampled output signal to a level appropriate for the signal canceller 131.

The mixer 510 converts the frequency of the attenuated output signal back to the intermediate frequencies (e.g., F01, IM3$i$, and IM5$i$, etc.) by mixing the attenuated output signal with a local oscillator signal to produce signal 564. In this exemplary embodiment, the signal 564 is passed to an optional filter 520 that removes any local oscillator leakage in the signal 564. The signal 564 is then passed to an optional variable attenuator 522 that attenuates the signal 564 before passing the attenuated signal 564 to the canceller 131.

The canceller 131 subtracts the sampled input signal received from coupler 111 from the signal 564 to produce signal 565. Thus, the amplitude of the F0$i$ component of the signal 565 is reduced relative to that of the signal 563 output by the power amplifier 105 while the amplitude of the intermodulation components remain substantially unchanged or similar to that of the signal 563 (minus the sum of the loss between the output of the power amplifier 105 and the output of the variable attenuator 522). In certain exemplary embodiments, the fundamental tones F0$i$ component of the signal 565 is cancelled entirely by the signal canceller 131. In certain alternative embodiments, the amplitude of the fundamental tones F0$i$ component of the signal 565 is reduced to a level similar to that of one or more of the intermodulation products of the signal 565. For example, as shown in the exemplary signal 565, the fundamental tones F0$i$ have amplitudes similar to that of the third order intermodulation products IM3$i$.

The signal 565, which includes the intermodulation products (e.g., IM3$i$, IM5$i$, etc.) and reduced fundamental tones F0$i$, is passed to signal canceller 132. The signal canceller 132 adjusts at least one of the gain, phase, and delay of the signal 565 and passes the adjusted signal to a variable gain amplifier ("VGA") 545. The VGA 545 further adjusts the gain of the signal 565. This adjusted signal, a compensation signal, is applied to main signal path via coupler 112. The compensation signal is frequency converted by the mixer 505 to the carrier frequency (e.g., to convert IM3$i$, IM5$i$, etc. into IM3$r$, IM5$r$, etc), and is passed to the power amplifier 105 for amplification. This amplified and frequency converted compensation signal output by the power amplifier 105 cancels or reduces the amplitude of the intermodulation products generated by the power amplifier 105. The controller 150 monitors the signal 565 to determine how much the intermodulation products are reduced by the compensation signal and adjusts the settings (e.g., I-values and Q-values of the cancellers 131 and 132) to control the reduction and/or cancellation as described above with reference to FIGS. 4A and 4B.

The aforementioned mixer 505, a device which is typically present in the original signal path without the linearization method, is reused by the linearizer 501 to convert the compensation signal up to RF, where the non-linearity is generated and also cancelled or suppressed. However if the intermediate frequency is not suitable for the signal cancellers 131, 132, another mixer may be inserted in the path between coupler 111 and signal canceller 131 as well as a second mixer in the path between the coupler 112 and the output of the signal canceller 132, in addition to shifting both couplers 111, 112 behind filter 515 directly to the PA input. The LO frequency of these two mixers and mixer 510 is the same and may be chosen as convenient for all blocks. In this exemplary system, the linearization method is completely independent of any available frequency in the original signal path and PAs generating intermodulation products at e.g. 20 times the frequency where the linearization method operates may be improved.

Figure 6:
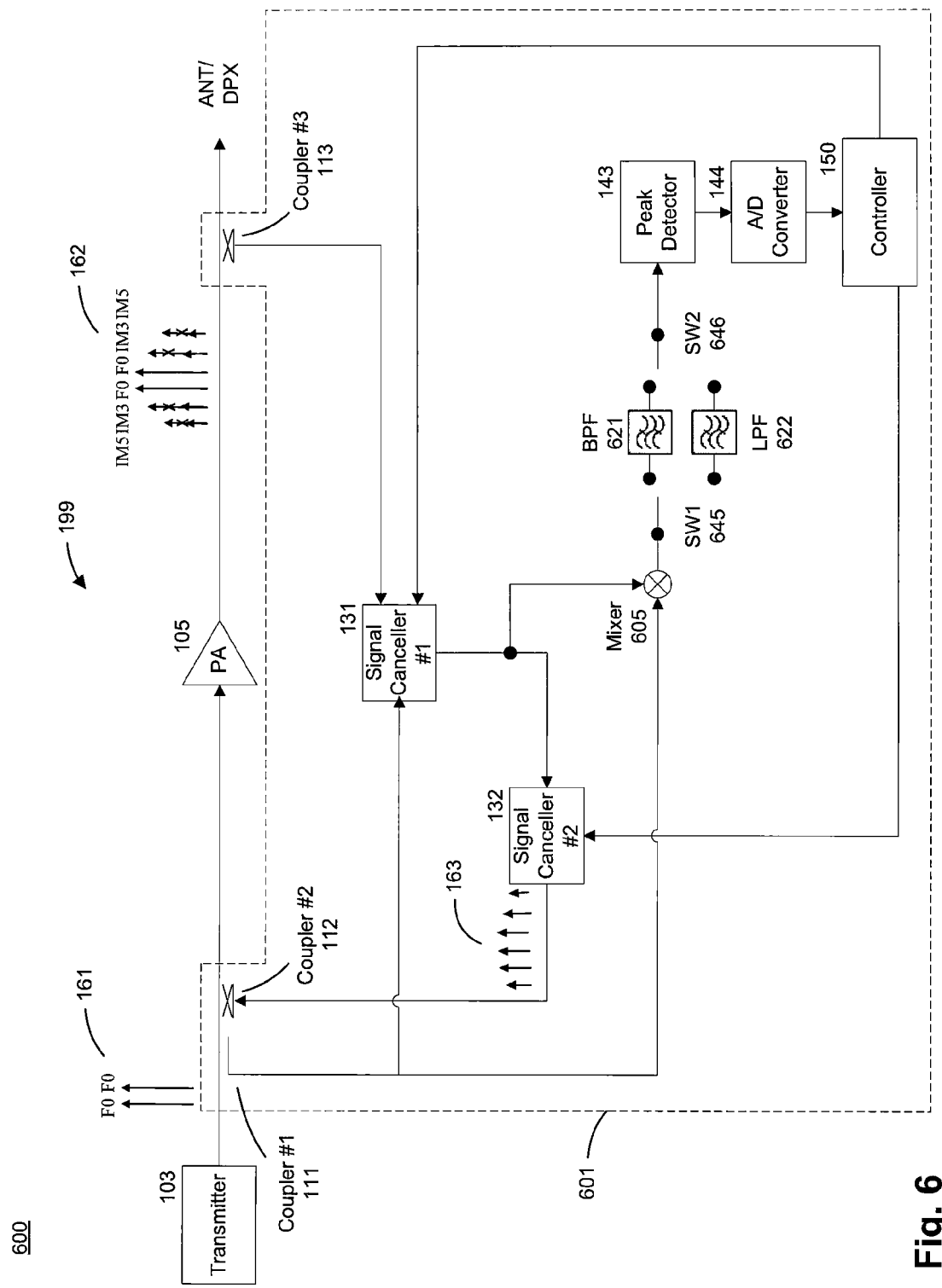
FIG. 6 is a functional block diagram of a system having a linearizer for improving the linearity of a power amplifier, in accordance with certain exemplary embodiments.

FIG. 6 is a functional block diagram depicting a system 600 having a linearizer 601 for improving the linearity of a power amplifier 105, in accordance with certain exemplary embodiments. The linearizer 601 is yet another alternative embodiment to the linearizer 101 illustrated in FIG. 1 and discussed above. Referring to FIG. 6, the system 600 includes the linearizer 601 that provides an alternative calibration process to that of the linearizer 101. In particular, the linearizer 601 includes a mixer 605, a band-pass filter 621 and a low-pass filter 622 disposed between the signal cancellers 131 and 132 and a peak detector 143.

One input of the mixer 605 connects to the output of canceller 131, sharing the intermodulation products and fundamental tones F0 (being cancelled) with the input of canceller 132. The other input of the mixer 605 connects to coupler 111, sharing the sampled fundamental tones F0 with canceller 131. The inputs of the band-pass filter 621 and low-pass filter 622 are connected to the output of mixer 605 via a switch 645. Similarly, the outputs of the filters 621, 622 are connected to the peak detector 143 via a switch 646. The controller 150 operates both switches 645, 646 via a control signal as described below.

In certain exemplary embodiments, the low-pass filter 622 has a bandwidth of the total bandwidth "fc" of the communication signals being transmitted by the transmitter 103 via the power amplifier 105 (e.g., direct current ("DC") to 60 MHz for the Universal Mobile Telecommunications System frequency band 2100 ("UMTS2100")). In certain exemplary embodiments, the band-pass filter 621 has a pass-band frequency either between fc and 2*fc (e.g., 60 MHz to 120 MHz for UMTS2100) or between 2*fc and 3*fc (e.g., 120 MHz to 180 MHz for UMTS2100).

By having the mixer 605 and the filters 621, 622 configured in this way, the controller 150 of the exemplary linearizer 601 can monitor (via the peak detector 143 and A/D converter 144) the power level of the fundamental tones F0 for adjusting the inner loop, as well as measure the power level of the intermodulation products for adjusting the outer loop. The inner loop calibration process of the linearizer 601 begins by positioning the switch 645 to connect the output of the mixer 605 to the input of the low-pass filter 622 while the outer loop is inactive (in a power down mode) or in a minimum forward gain mode. The switch 646 is also positioned to connect the output of the low-pass filter 622 to the input of the peak detector 143. In this configuration, the output of the peak detector 143 indicates the power level of the fundamental tones F0. The controller 150 can monitor this power level and adjust the settings (e.g., I-value and Q-value) of the canceller 131 to cancel or reduce the power level of the fundamental tones F0 in the signal at the output of the canceller 131.

The outer loop calibration process of the linearizer 601 begins by positioning the switch 645 to connect the output of the mixer 605 to the input of the band-pass filter 621 while the outer loop is in a normal operation mode whereby the canceller 132 is actively adjusting the gain and phase (and optionally the delay) of the signal output by the canceller 131 to produce a compensation signal. The switch 646 is also positioned to connect the output of the band-pass filter 621 to the input of the peak detector 143. In this configuration, the output of the peak detector 143 indicates the power level of the intermodulation products. The controller 150 can monitor this power level and adjust the settings (e.g., I-value and Q-value) of the canceller 132 to cancel or reduce the power level of the intermodulation products of the signal 162 output by the power amplifier 105.

In certain exemplary embodiments, the inner loop and outer loop calibrations of the linearizer 601 are implemented on the same chip as the power amplifier and can ensure continuous operation of calibration and measurement without the involvement of the base-station or another host system where the power amplifier 105 may reside.

Figure 7:
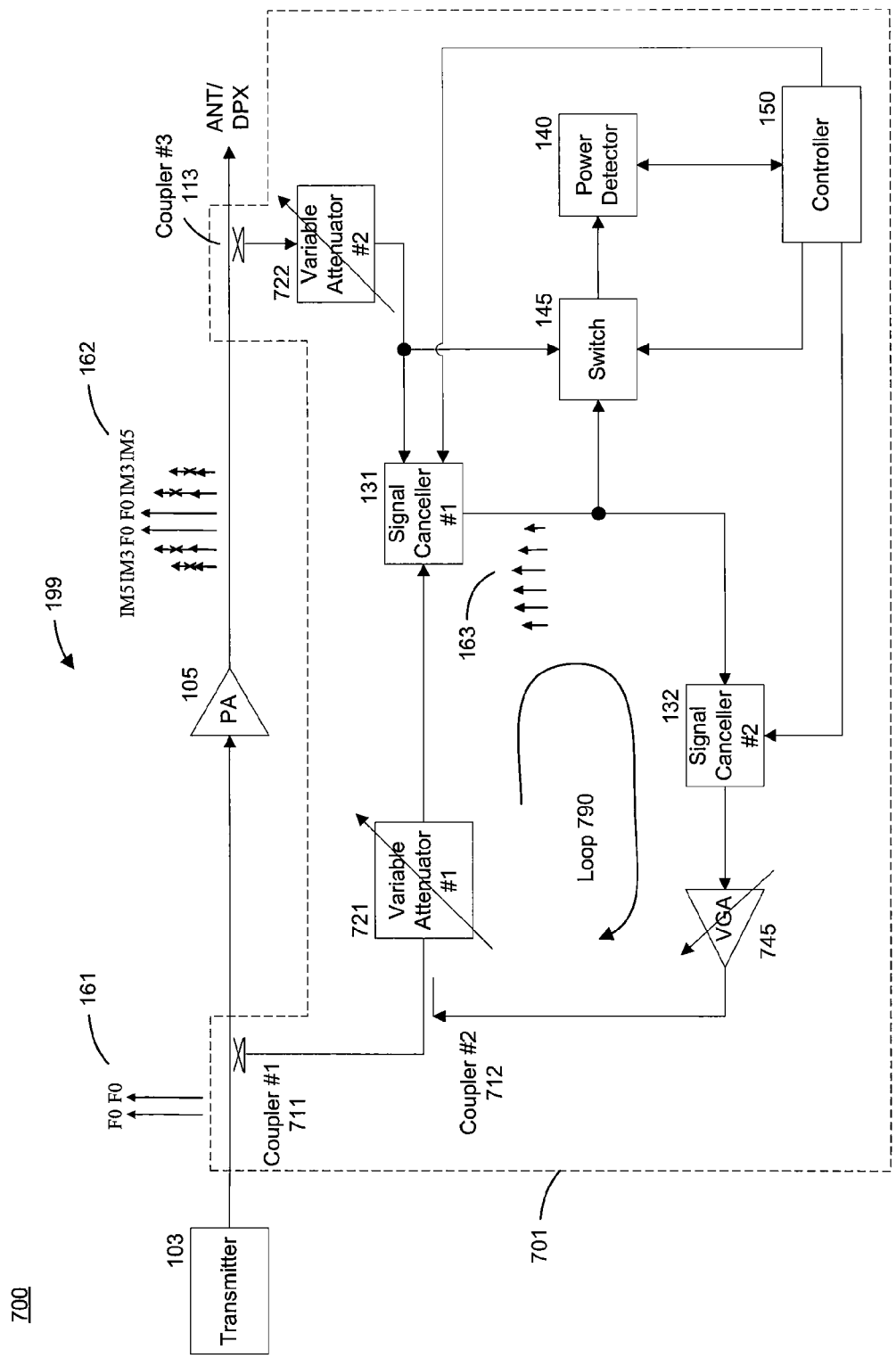
FIG. 7 is a functional block diagram of a system having a linearizer for improving the linearity of a power amplifier, in accordance with certain exemplary embodiments.

FIG. 7 is a functional block diagram depicting a system 700 having a linearizer 701 for improving the linearity of a power amplifier 105, in accordance with certain exemplary embodiments. The linearizer 701 is yet another alternative embodiment to the linearizer 101 illustrated in FIG. 1 and discussed above. Referring to FIG. 7, the system 700 includes the linearizer 701 which differs from the linearizer 101 by employing a shared coupler 711 in place of couplers 111, 112 along the transmit path 199. This shared coupler 711 is used for both the fundamental tones F0 sampling and the intermodulation product feedback. In this exemplary embodiment, the signal output by the canceller 132 having the intermodulation product feedback is coupled to the path of coupler 711 via VGA 745 and a coupler 712 (which may be directional). In certain exemplary embodiments, the directivity of coupler 712 is greater than the sum of the total gain of variable attenuator 721, canceller 131, canceller 132, VGA 745, and coupling coefficient of coupler 712. This helps to ensure stability of loop 790. This shared coupler embodiment may also be used in the linearizers 101, 501, and 601 illustrated in FIGS. 1, 5, and 6, respectively.

Figure 8:
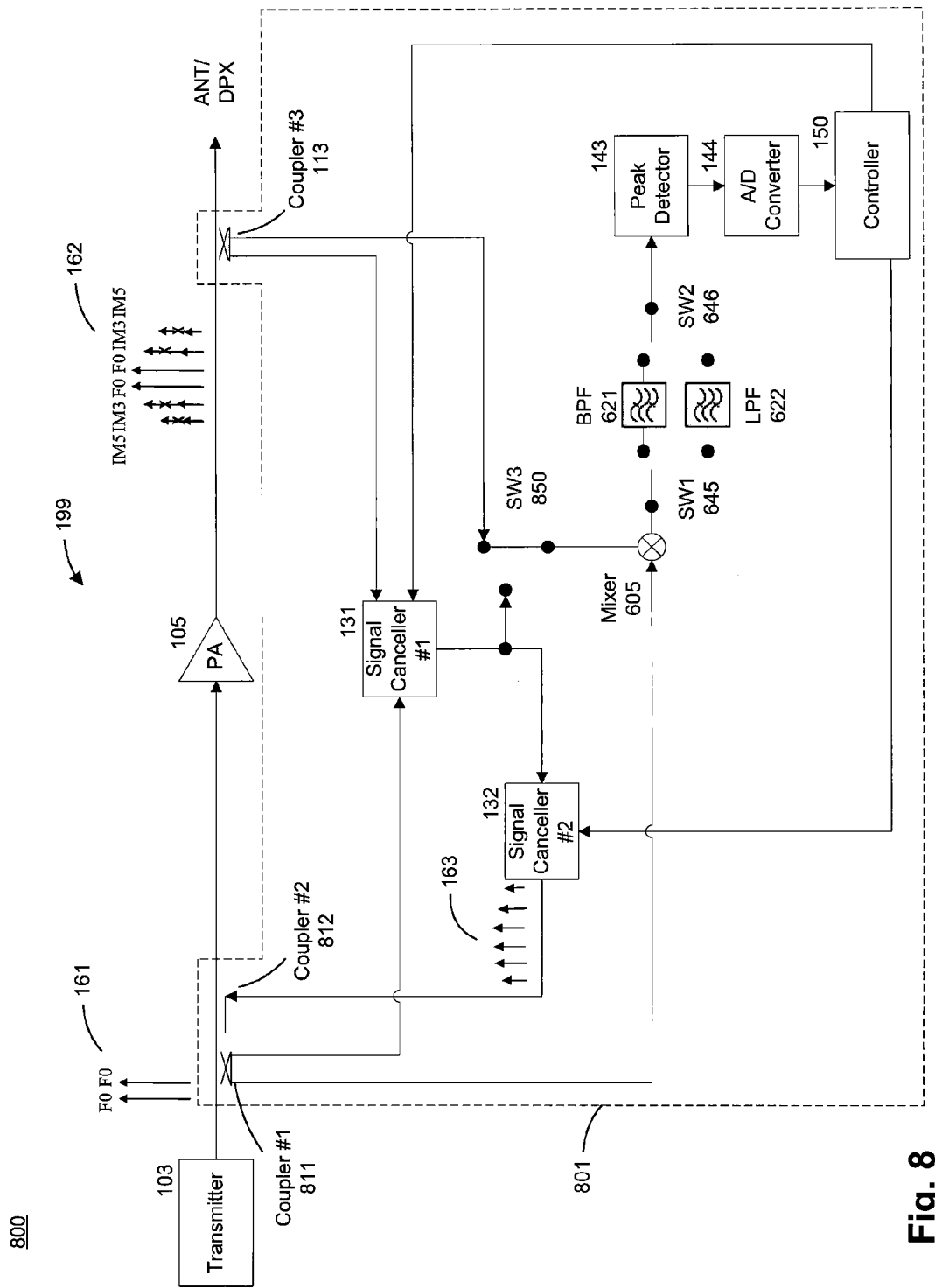
FIG. 8 is a functional block diagram of a system having a linearizer for improving the linearity of a power amplifier, in accordance with certain exemplary embodiments.

FIG. 8 is a functional block diagram of a system 800 having a linearizer 801 for improving the linearity of a power amplifier 105, in accordance with certain exemplary embodiments. The linearizer 801 is an alternative embodiment to the linearizer 601 illustrated in FIG. 6 and discussed above. Referring to FIG. 8, the exemplary linearizer 801 includes an additional switch 850 communicably coupled to the controller 150. The controller 150 operates the switch to select between a power measurement at the output of the signal canceller 131 and at the input of the signal canceller 131. This switch 850 enables the controller 150 to monitor the power level of the fundamental tones F0 and/or the intermodulation products at the output of the power amplifier 105. Another change relative to the linearizer 601 is that directional coupler 811 replaces directional coupler 111, so that the sampling of signal 161 would not be shared between the canceller 131 and the input of mixer 605. Also, directional coupler 812 replaces coupler 112 so that the feedback compensation signal does not appear in the sample of signal 161 for canceller 131.

Figure 9:
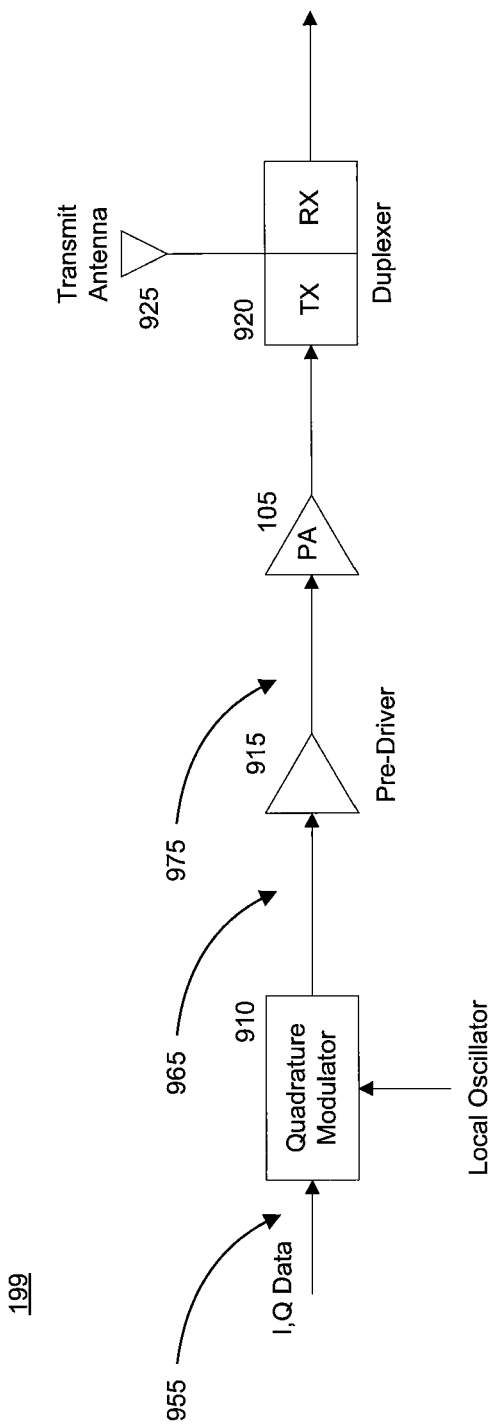
FIG. 9 is a functional block diagram of a transmit path of a power amplifier, in accordance with certain exemplary embodiments.

FIG. 9 is a functional block diagram depicting the transmit path 199 that can be implemented for the systems 100, 500, 600, 700, and 800 of FIGS. 1, 5, 6, 7, and 8, respectively. In particular, FIG. 9 depicts a quadrature modulator 910, a pre-driver 915, and a transmit antenna 925 coupled to a duplexer 920. This figure is provided to illustrate additional locations along the transmit path 199 where a sample of the fundamental tones F0 of a signal transmitted by a transmitter may be obtained. For example, the sample of the fundamental tones F0 may be obtained at point 955 at the input of the quadrature modulator 910, at point 965 at the input of the pre-driver 965, or at point 975 at the input of the power amplifier 105. In addition, the feedback signal (e.g., output of the signal canceller 132) can be applied at any of these points 955, 965, or 975. However, the feedback point is typically downstream from the sampling point of the fundamental tones F0 to avoid oscillation and intermodulation product feed-through to the input of the canceller 131. Using point 955 may require additional circuitry to convert I-values and Q-values to a combined analog signal for the input of signal canceller 131 and/or a combined analog signal back to I,Q data at the output of the signal canceller 132.

The linearizers discussed above are integratable as a chip, die, or IP into any type of power amplifier. In certain exemplary embodiments, the linearizers are self-contained and can be coupled to the input and output of a power amplifier using couplers as described above. In certain exemplary embodiments, these self-contained linearizers are fabricated in one or more integrated circuits.

The linearizers can adjust any combination of the amplitude, phase, and delay of either signals sampled at the input of a power amplifier or signals sampled at the output of a power amplifier using a signal (e.g., analog voltages or a digital control signal) driven by one or more algorithms such that the ratio of the intermodulation products to fundamental tones F0 in the signal output by the power amplifier is reduced or cancelled. In certain exemplary embodiments, the signal cancellers employ phase shifting without delay.

The linearizers also can adjust any combination of the amplitude, phase, and delay of signals sampled at the input of a power amplifier or signals sampled at the output of a power amplifier using a signal (e.g., analog voltages or a digital control signal) driven by one or more algorithms such that the ratio of the fundamental tones F0 to the intermodulation products for the signal output by the power amplifier is increased.

The linearizers also can selectively cancel (or reduce the amplitude of) one or more particular pairs of intermodulation products in the signal output by a power amplifier. For example, the linearizers may cancel or suppress two pairs of intermodulation products from the signal output by the power amplifier.

The linearizers also can cancel (or reduce) noise or spurs generated in the signal path between the coupler 111 and 113. The linearizer 501 also can cancel noise (e.g. caused by mixer 505) present on the input signal 562 from the signal 563 at the output of the power amplifier 105. The linearizer 101 also can cancel (or reduce) noise generated by the power amplifier 105 in the output signal 162.

Although two signal cancellers are depicted in each of the exemplary embodiments discussed above, additional signal cancellers can also be used in the linearizers. For example, the signal canceller 131 of FIG. 1 can include multiple signal cancellers to increase the bandwidth of fundamental tones F0 cancellation. In addition or in the alternative, the signal canceller 132 of FIG. 1 can include multiple signal cancellers to increase the bandwidth of intermodulation product cancellation. When using multiple signal cancellers in parallel, one or more algorithms illustrated in FIG. 29-31 of patent application Ser. No. 13/014,681, entitled, "Methods and Systems for Noise and Interference Cancellation," and filed on the same date as this application, may be executed by the controller 150 to determine the preferred settings for each of the signal cancellers.

The linearizers also can include and execute one or more tuning algorithms that enable the linearizers to find preferred settings for the signal cancellers such that the ratio of fundamental tones F0 to intermodulation products at the output of a power amplifier is increased.

The linearizers also can use a modulated spectrum as an input signal to a power amplifier. The modulated spectrum can have modulation and/or a coding scheme that provides a larger ratio of fundamental tones F0 to the intermodulation products in the signal output by the power amplifier, as specified in 3GPP and/or 4G cellular communication standard(s).

The invention can be used with computer hardware and software that performs the methods and processing functions described above. As will be appreciated by those skilled in the art, the systems, methods, and procedures described herein can be embodied in a programmable computer, computer executable software, or digital circuitry. The software can be stored on computer readable media. For example, computer readable media can include a floppy disk, RAM, ROM, hard disk, removable media, flash memory, memory stick, optical media, magneto-optical media, CD-ROM, etc. Digital circuitry can include integrated circuits, gate arrays, building block logic, field programmable gate arrays ("FPGA"), etc.

Although specific embodiments of the invention have been described above in detail, the description is merely for purposes of illustration. It should be appreciated, therefore, that many aspects of the invention were described above by way of example only and are not intended as required or essential elements of the invention unless explicitly stated otherwise. Various modifications of, and equivalent steps corresponding to, the disclosed aspects of the exemplary embodiments, in addition to those described above, can be made by a person of ordinary skill in the art, having the benefit of the present disclosure, without departing from the spirit and scope of the invention defined in the following claim(s), the scope of which is to be accorded the broadest interpretation so as to encompass such modifications and equivalent structures.

What is claimed is:

1. A system for improving linearity of a power amplifier, comprising:

a first input operable to couple to an input signal path of the power amplifier for obtaining a first sample of an input signal of the power amplifier;

a second input operable to couple to an output signal path of the power amplifier for obtaining a second sample of an output signal of the power amplifier, the output signal comprising at least one non-linearity component imposed on the output signal by the power amplifier, the second sample comprising at least one sampled non-linearity component corresponding to the at least one non-linearity component;

an output operable to couple to the input signal path of the power amplifier, the output for applying a linearity improving signal to the input signal path; and a linearizer electrically coupled to the first input, the second input, and the output, the linearizer comprising:

a first signal canceller for receiving the first sample from the first input and the second sample from the second input and deducting the first sample from the second sample to produce an intermediate signal comprising the at least one sampled non-linearity component; and a second signal canceller coupled between the first signal canceller and the output, the second signal canceller operable to produce the linearity improving signal by adjusting at least one of amplitude, phase, and delay of the at least one sampled non-linearity component of the intermediate signal, the linearity improving signal operable to reduce an intensity of the at least one non-linearity component in response to being coupled to the input signal path and amplified by the power amplifier.

2. The system of claim 1, wherein the first input, the second input, and the output each comprise a coupler.

3. The system of claim 1, further comprising a first attenuator disposed between the first input and the first signal canceller and a second attenuator disposed between the second input and the first signal canceller.

4. The system of claim 1, further comprising an amplifier disposed between the output of the second signal canceller and the output.

5. The system of claim 1, wherein the first sample comprises a modulated signal component and the second sample comprises an amplitude adjusted modulated signal component, and wherein the first canceller reduces intensity of the amplitude adjusted modulated signal component while leaving intensity of the at least one sampled non-linearity component of the second sample substantially unchanged to produce the intermediate signal.

6. The system of claim 1, further comprising:
a power detector for measuring intensity of the modulated signal component of the first sample; and
a controller for receiving the intensity measurement from the power detector and for adjusting at least one setting of the first signal canceller based on the intensity measurement.

7. The system of claim 1, wherein the first canceller is operable to adjust at least one of amplitude, phase, and delay of at least one component of the first sample based on an in-phase setting and a quadrature setting prior to deducting the first sample from the second sample.

8. The system of claim 1, wherein the second signal canceller adjusts at least one of amplitude, phase, and delay of the at least one sampled non-linearity component of the intermediate signal based on an in-phase setting and a quadrature setting.

9. The system of claim 1, further comprising:
a power detector for measuring intensity of the at least one sampled non-linearity component; and
a controller for receiving the intensity measurement from the power detector and for adjusting at least one setting of the second signal canceller based on the intensity measurement.

10. The system of claim 1, further comprising:
a power detector comprising a power detector input and a power detector output;
a switch comprising:
a first switch input coupled to an input of the first signal canceller;
a second switch input coupled to the output of the first signal canceller;
a switch output coupled to the power detector input; and
a controller electrically coupled to the switch and operable to configure the switch to couple the first switch input to the switch output or the second switch input to the switch output.

11. The system of claim 10, wherein the power detector comprises:
a peak detector for measuring an intensity of a signal; and
a filter disposed between the power detector input and the peak detector.

12. The system of claim 1, further comprising a frequency converting mixer disposed between the first input and the first signal canceller.

13. The system of claim 1, wherein the linearizer is fabricated in one or more integrated circuits.

14. A method for reducing non-linearity components imposed on a signal output by a power amplifier, the method comprising:
receiving a second sample of an output signal output by the power amplifier, the output signal comprising at least one non-linearity component imposed on the output signal by the power amplifier, the first sample comprising at least one sampled non-linearity component corresponding to the at least one non-linearity component;
determining an intensity level of the at least one sampled non-linearity component;
generating a compensation signal by adjusting at least one of phase, amplitude, and delay of the at least one sampled non-linearity component based on the intensity level;
applying the compensation signal to an input of the power amplifier; and
in response to applying the compensation signal to the input, reducing amplitude of the at least one non-linearity component.

15. The method of claim 14, wherein the at least one non-linearity component comprises an intermodulation product imposed on the output signal by the power amplifier.

16. The method of claim 14, further comprising:
receiving a first sample of an input signal to the power amplifier; and
reducing an intensity level of a fundamental tone component of the second sample by subtracting the first sample from the second sample.

17. The method of claim 14, wherein the at least one of phase, amplitude, and delay is adjusted based on an in-phase setting and a quadrature setting.

18. The method of claim 17, further comprising executing a computer program using the intensity level as a feedback value to determine the in-phase setting and the quadrature setting.

19. A method for reducing non-linearity components of an output signal of a power amplifier, the method comprising:
(a) obtaining a first sample of an input signal from an input signal path to the power amplifier, the first sample comprising a first modulated signal component;
(b) obtaining a second sample of an output signal of the power amplifier, the output signal comprising at least one non-linearity component imposed on the output signal by the power amplifier, the second sample comprising a second modulated signal component and at least one sampled non-linearity component;
(c) generating an intermediate signal by reducing amplitude of the second modulated signal component of the second sample by deducting the first sample from the second sample;
(d) determining an intensity level of the at least one sampled non-linearity component;
(e) producing a compensation signal by adjusting at least one of phase, amplitude, and delay of the at least one sampled non-linearity component based on the intensity level;
(f) applying the compensation signal to the input signal path; and
(g) in response to applying the compensation signal to the input signal path and to the power amplifier amplifying the compensation signal, reducing an intensity level of the at least one non-linearity component.

20. The method of claim 19, further comprising repeating (a) through (g) for a plurality of iterations to improve the reduction of the intensity level of the at least one non-linearity component.

21. The method of claim 19, further comprising converting a frequency of the second sample.

22. The method of claim 19, further comprising converting both the frequency of the input signal and the frequency of the output signal to a similar frequency.

23. The method of claim 19, wherein the compensation signal is applied to the input signal path between a location where the first sample is obtained and an input of the power amplifier.

24. The method of claim 19, wherein the at least one of phase, amplitude, and delay is adjusted based on an in-phase setting and a quadrature setting.

25. The method of claim 19, further comprising executing a computer program using the intensity level as a feedback value to determine the in-phase setting and the quadrature setting.

* * * * *